(12) United States Patent
Chui (10) Patent No.: US 7,463,066 B1
(45) Date of Patent: Dec. 9, 2008

(54) RAIL-TO-RAIL SOURCE FOLLOWERS

(75) Inventor: Siew Yong Chui, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/737,085

(22) Filed: Apr. 18, 2007

Related U.S. Application Data (63) Continuation of application No. 11/142,176, filed on May 31, 2005, now Pat. No. 7,208,974.

(60) Provisional application No. 60/613,954, filed on Sep. 27, 2004.

(51) Int. Cl.
*H03K 19/094* (2006.01)
*H03K 19/0175* (2006.01)

(52) U.S. Cl. .............................. 326/68; 326/26; 326/80

(58) Field of Classification Search ............. 326/26–27, 326/33–34, 82–83
See application file for complete search history.

(56) References Cited

U.S. PATENT DOCUMENTS

| 5,917,378 A | 6/1999 | Juang | |
|---|---|---|---|
| 6,624,669 B1 * | 9/2003 | Tsuchi | 327/108 |
| 6,919,743 B2 * | 7/2005 | Tobita | 327/108 |
| 7,208,974 B1 * | 4/2007 | Chui | 326/33 |

* cited by examiner

*Primary Examiner*—Anh Q Tran (57) ABSTRACT

Circuits and methods are provided for producing a rail-to-rail output voltage. A circuit includes a level shifter and a source follower. The level shifter receives an input signal and applies a compensation voltage to the input signal relative to a voltage level of the input signal in steady-state. The source follower produces an output signal and, responsive to variations in the voltage level of the input signal, changes the voltage level of the output signal.

26 Claims, 5 Drawing Sheets

RAIL-TO-RAIL SOURCE FOLLOWERS

CROSS-REFERENCE TO RELATED APPLICATIONS

The present application is a continuation of U.S. patent application Ser. No. 11/142,176, filed May 31, 2005, which claims priority to U.S. Provisional Patent Application No. 60/613,954, filed on Sep. 27, 2004, which are incorporated herein by reference in their entirety.

BACKGROUND

The following disclosure generally relates to electrical circuits and signal processing.

Some circuit applications require a low output impedance. For these applications, a source follower (sometimes referred to as a common drain) can be used as a buffer to reproduce a signal at a reduced output impedance.

Figure 1A:
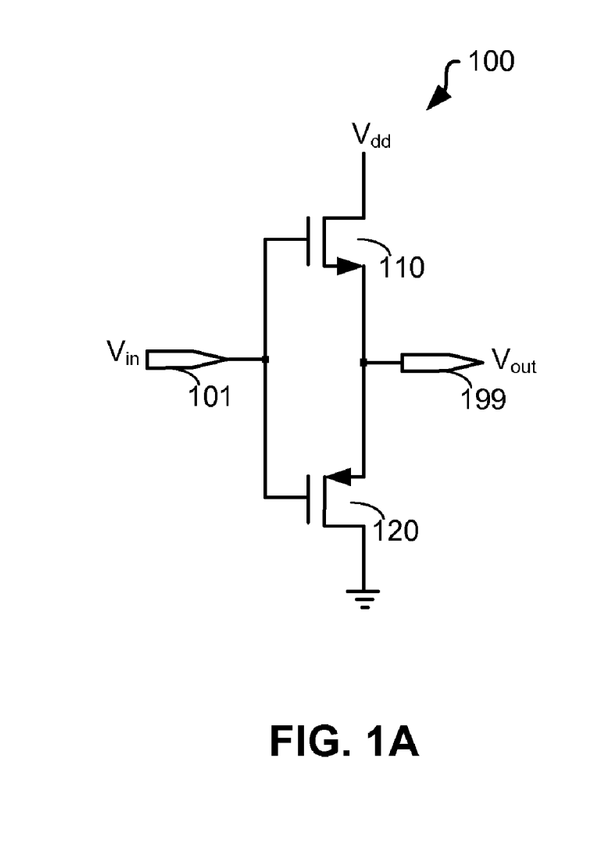
FIG. 1A is a schematic diagram illustrating a conventional source follower.

FIG. 1A is a schematic diagram illustrating a conventional source follower 100. Source follower 100 includes an input terminal 101, an NMOS-type MOSFET 110 (i.e., a Metal-Oxide Field-Effect Transistor having an n-type well), a PMOS-type MOSFET 120 (i.e., an MOSFET having an p-type well), and an output terminal 199. Input terminal 101 is coupled to respective gates of MOSFET 110 and MOSFET 120 for receiving an input signal $V_{IN}$. Output terminal 199 is coupled to respective sources of MOSFET 110 and MOSFET 120 for producing a conventional output signal $V_{OUT}$. When a voltage level of input signal $V_{IN}$ at input terminal 101 increases, MOSFET 110 and MOSFET 120 increase a voltage at their drains, and consequentially, increase a voltage level of conventional output signal $V_{OUT}$ at output terminal 199. The opposite occurs when the voltage level of the input signal $V_{IN}$ decreases.

Figure 1B:
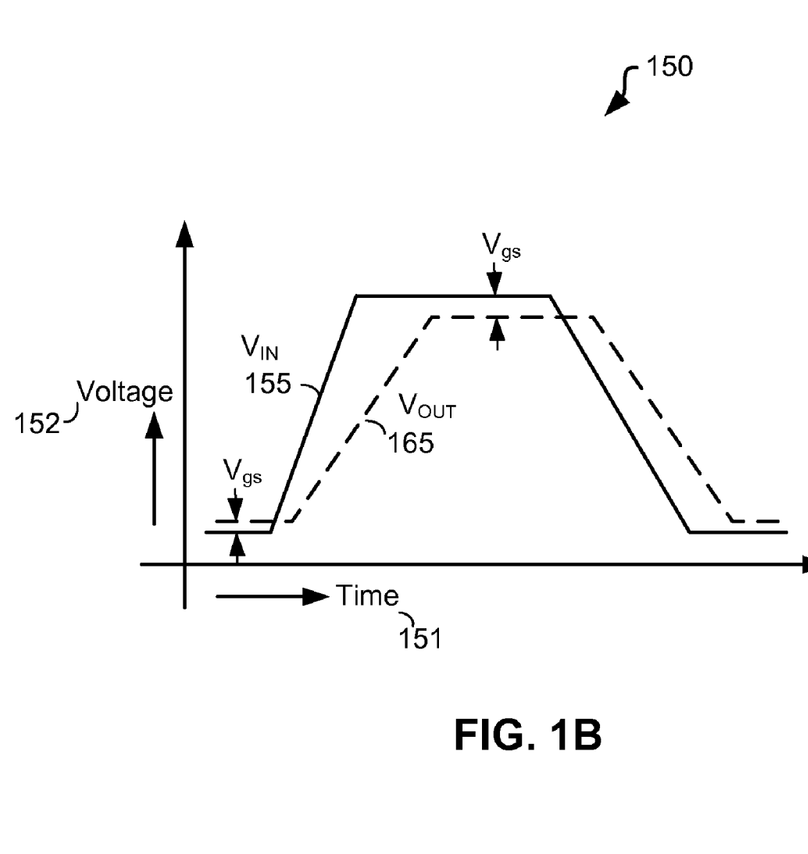
FIG. 1B is a graph illustrating voltage levels of an input signal relative to an output signal of the conventional source follower of FIG. 1A.

FIG. 1B is a graph 150 illustrating output voltage characteristics of source follower 100 relative to the input voltage. Graph 150 includes an x-axis 151 representing time, a y-axis 152 representing voltage, and shows a plot of input signal $V_{IN}$ 155 and conventional output signal $V_{OUT}$ 165. As shown in FIG. 1B, output signal $V_{OUT}$ 165 lags input signal $V_{IN}$ 155 with respect to time. Also, conventional output signal $V_{OUT}$ 165 is clipped by a value $V_{gs}$ (the gate/source voltage of MOSFET 110) relative to input signal $V_{IN}$ 155.

Conventional source follower performance suffers from many drawbacks. One problem is that applications such as a motor controller require an output signal having a higher slew rate than a conventional source follower, with a lagging output signal, is able to produce. Another problem is that a reduced output swing in an output signal may not be sufficient for many applications.

SUMMARY

This disclosure generally describes source follower circuits and methods for producing a rail-to-rail output voltage. In general, in one aspect, a circuit is provided. The circuit includes a level shifter to receive an input signal and apply an adjustment voltage to produce a voltage level in an output signal of the circuit during a steady-state that substantially equates a voltage level of the input signal during a steady-state; a source follower in communication with the level shifter, the source follower producing an output signal and, responsive to variations in the voltage level of the input signal during a transient state, changing the voltage level of the output signal using a biasing current; and a current compensation circuit, in communication with the source follower and receiving the input and output signals and, responsive to a difference between the voltage levels of the input and output signals, the current compensation circuit varying an amount of the biasing current.

Particular implementations can include one or more of the following features. The circuit can further include a current source to provide a constant current bias to an output node, wherein the current compensation circuit varies an amount of the biasing current as a portion of a constant current bias. The current source can source the constant current bias to the output node, and the current compensation circuit can sink a current from the output node. The current source can sink the constant current bias from the output node, and the current compensation circuit can source a current to the output node. The current compensation circuit can include a first MOSFET coupled to an output node to sink a portion of the biasing current responsive to the difference between the voltage levels of the input and output signals. The current compensation circuit can further include a second current source and a second MOSFET coupled to the second current source and the first MOSFET, wherein the second MOSFET, responsive to the difference between the voltage levels of the input and output signals, sinks a portion of a second current produced by the second current source to control the first MOSFET. The current compensation circuit can further include a third MOSFET coupled to the second current source and receiving the output signal and a portion of the second current, and a fourth MOSFET coupled to the second current source and receiving the input signal and a portion of the second current, wherein the fourth MOSFET sources the portion of the second current sunk by the second MOSFET responsive to the difference between the voltage levels of the input and output signals. The first MOSFET can sink substantially all of the constant bias current responsive to the voltage levels between the input and output signals substantially equating.

The level shifter can apply the compensation voltage substantially equivalent to one or more gate/source voltages Vgs associated with the source follower. The level shifter can include a first MOSFET and a second MOSFET, the first and second MOSFETs having substantially complementary activation characteristics, wherein the first MOSFET adds the compensation voltage to the input signal and the second MOSFET removes the compensation voltage from the input signal.

The source follower can include a first MOSFET and a second MOSFET, the first and second MOSFETs having substantially complementary activation characteristics and producing the output signal. An input resistance associated the first MOSFET can discharge a portion of the biasing current to decrease the voltage level of the output signal, and an input resistance associated with the second MOSFET can discharge a portion of the biasing current to increase the voltage level of the output signal.

In general, in another aspect, a method is provided. The method includes receiving an input signal; applying a compensation voltage to the input signal to produce a voltage level in an output signal of the circuit during a steady-state that substantially equates a voltage level of the input signal during a steady-state; responsive to variations in the voltage level of the input signal during a transient state, changing the voltage level of the output signal using a biasing current; and responsive to a difference between the voltage levels, of the input and output signals, varying an amount of biasing current.

Particular implementations can include one or more of the following features. The method can further include providing a constant current bias to an output node, wherein varying includes varying the amount of the biasing current as a portion of a constant current bias. Providing can include sourcing the constant current bias to the output node, and wherein varying includes sinking a current from the output node. Providing can include sinking the constant current bias from the output node, and wherein varying includes sourcing a current to the output node. Varying can include sinking a portion of the biasing current responsive to the difference between the voltage levels of the input and output signals. Varying can include sinking a portion of a second current to control the bias current sinking. Varying can include receiving the output signal and a portion of the second current; receiving the input signal and a portion of the second current; and sourcing the portion of the second current sunk responsive to the difference between the voltage levels of the input and output signals. Sinking the portion of the biasing current can include sinking substantially all of the biasing current responsive to the voltage levels between the input and output signals substantially equating.

Applying can include applying the compensation voltage substantially equivalent to one or more gate/source voltages Vgs. Applying can include adding the compensation voltage to the input signal; and subsequently removing the compensation voltage from the input signal to produce the output signal.

The method can further include activating a first MOSFET substantially complementary to a second MOSFET to produce the output signal. The method can further include discharging a portion of the biasing current with a first input resistance to decrease the voltage level of the output signal, and discharging a portion of the biasing current with a second input resistance to increase the voltage level of the output signal.

In general, in another aspect, a circuit is provided. The circuit includes means for receiving an input signal; means for, in communication with the means for receiving, applying a compensation voltage to the input signal to produce a voltage level in an output signal of the circuit during a steady-state that substantially equates a voltage level of the input signal during a steady-state; responsive to variations in the voltage level of the input signal during a transient state, means for, coupled to the means for applying, changing the voltage level of the output signal using a biasing current; and responsive to a difference between the voltage levels, of the input and output signals, means for, coupled to the means for changing, varying an amount of biasing current.

Particular implementations can include one or more of the following features. The circuit can further include means for, in communication with the means for varying, providing a constant current bias to an output node, wherein the means for varying varies an amount of the biasing current as a portion of the constant current bias. The means for providing can source the constant current bias to the output node, and the means for varying can sink a current from the output node. The means for providing can sink the constant current bias from the output node, and the means for varying can source a current to the output node. The means for varying can sink a portion of the biasing current responsive to the difference between the voltage levels of the input and output signals. The means for varying can sink a portion of a second current to control the bias current sinking. The means for varying can include means for receiving the output signal and a portion of the second current; means for receiving the input signal and a portion of the second current; and means for, in communication with the means for receiving the output signal, sourcing the portion of the second current sunk responsive to the difference between the voltage levels of the input and output signals. The means for varying can sink substantially all of the biasing current responsive to the voltage levels between the input and output signals substantially equating.

The means for applying can apply the compensation voltage substantially equivalent to one or more gate/source voltages Vgs. The means for applying can include means for adding the compensation voltage to the input signal, and means for removing the compensation voltage from the input signal to produce the output signal.

The circuit can further include means for activating a first MOSFET substantially complementary to a second MOSFET to produce the output signal. The circuit can further include means for discharging a portion of the biasing current with a first input resistance to decrease the voltage level of the output signal, and means for discharging a portion of the biasing current with a second input resistance to increase the voltage level of the output signal.

Aspects of the invention may offer one or more of the following advantages. A proposed source follower circuit can produce an output signal $V_{OUT}$ having a rail-to-rail voltage level relative to a voltage level of an input signal $V_{IN}$ (e.g., a voltage level of the input signal $V_{IN}$ in steady-state) The source follower circuit can have an improved slew rate while the input signal is transient. The source follower can also produce a low output impedance and a low quiescent current.

DETAILED DESCRIPTION

Figure 2:
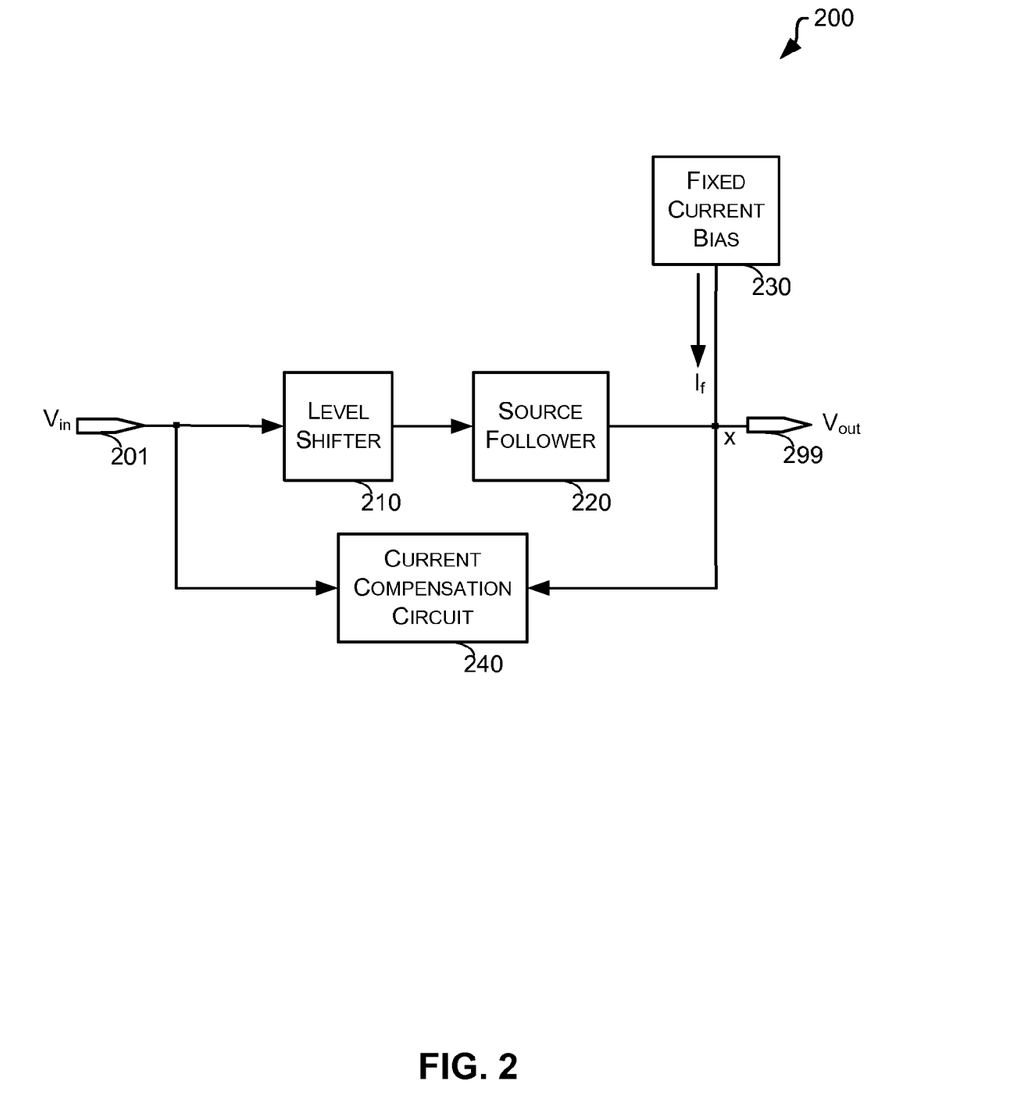
FIG. 2 is a block diagram illustrating a proposed circuit to produce a rail-to-rail output voltage.

FIG. 2 is a block diagram illustrating a circuit 200 operable to produce a rail-to-rail output voltage and present a low output impedance. Circuit 200 includes an input terminal 201, a level shifter 210, a source follower 220, a fixed current bias 230, a current compensation circuit 240, and an output terminal 299. Details associated with specific implementations of these components are discussed below with respect to FIG. 3A.

Level shifter 210 includes an input for receiving an input signal $V_{IN}$ from input terminal 201. Level shifter 210 can adjust a voltage level of input signal $V_{IN}$. In one implementation, the adjustment is configured in accordance with voltage changes experienced by input signal $V_{IN}$ within source follower 220 (e.g., ±gate/source voltage $V_{gs}$ depending on whether input signal $V_{IN}$ is at a maximum or a minimum) as discussed more fully below.

Source follower 220 includes an input for receiving a shifted input signal $V_{IN}$ from level shifter 210. Source follower 220 includes an output for producing compensated output signal $V_{OUT}$ at output terminal 299. Source follower 220 produces compensated output signal $V_{OUT}$ responsive to level-shifted input signal $V_{IN}$. In one implementation, source follower 220 produces compensated output signal $V_{OUT}$ which substantially equates input signal $V_{IN}$ prior to level shifting. In another implementation, source follower 220 produces compensated output signal $V_{OUT}$ to have rise times and/or fall times that approximate input signal $V_{IN}$ during a transient operation with a relatively small delay in time. The transient operation of source follower 220 is discussed in greater detail below.

Fixed current bias 230 includes an output for sourcing a constant current signal $I_f$. In one implementation, fixed current bias 230 sources constant current signal $I_f$ at a magnitude that assists source follower 220 in approximating input signal $V_{IN}$ during transient operation as controlled by current compensation circuit 240 (i.e., reduces delay time).

Current compensation circuit 240 is coupled to input signal $V_{IN}$ and compensated output signal $V_{OUT}$. Current compensation circuit 240 operates to variably compensate output signal $V_{OUT}$ depending on a state of input signal $V_{IN}$ relative to output signal $V_{OUT}$. In one implementation, when circuit 200 is in steady-state (i.e., the input voltage $V_{IN}$ substantially equates the output voltage $V_{OUT}$), current compensation circuit 240 sinks substantially all of constant current signal $I_f$. However, when input signal $V_{IN}$ is transient, a level of sunk current varies in order to provide a corresponding increase/decrease to compensated output signal $V_{OUT}$. Transient operation is discussed in greater detail below.

Figure 3A:
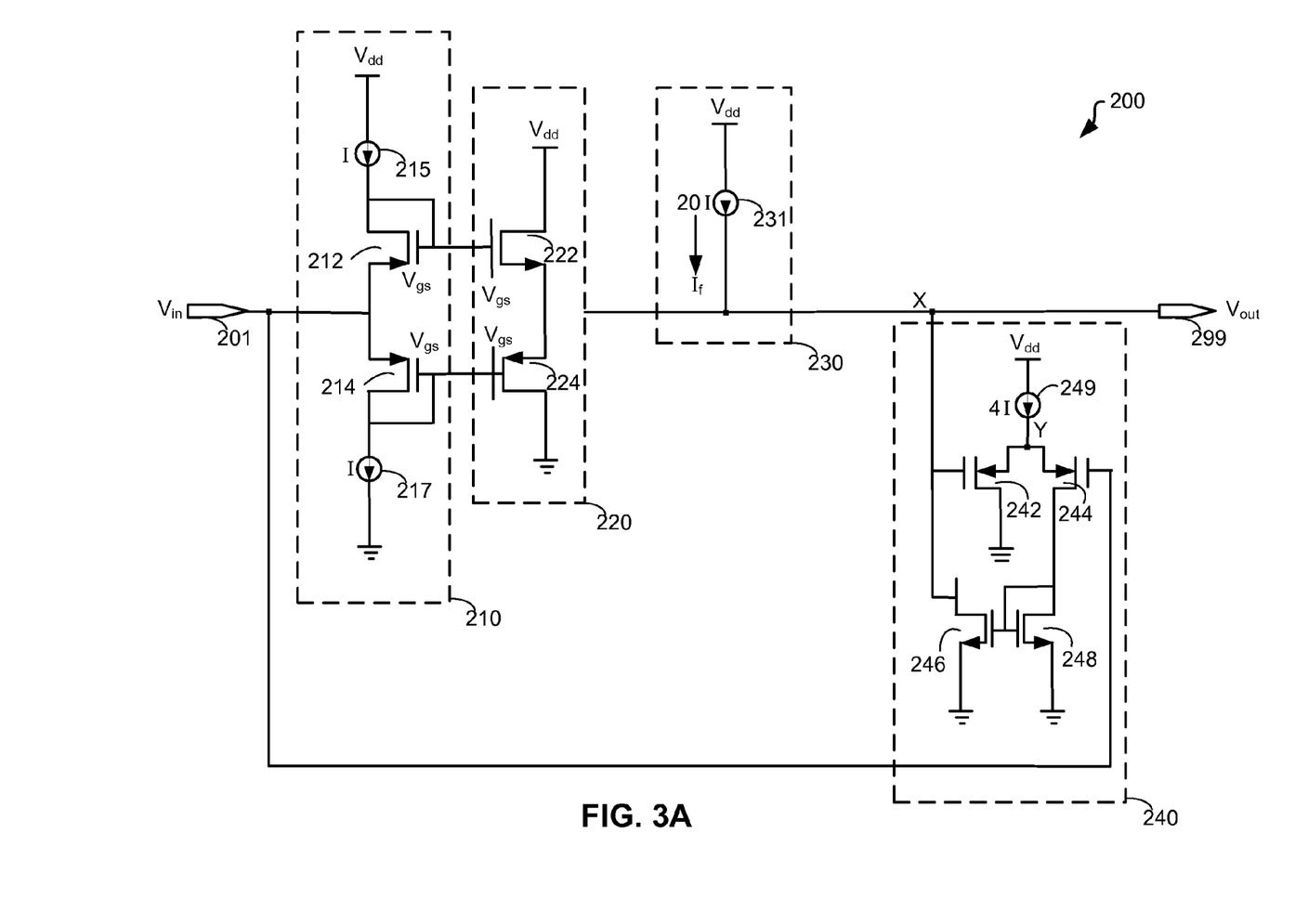
FIG. 3A is a schematic diagram illustrating the circuit of FIG. 2.

FIG. 3A is a schematic circuit diagram illustrating one implementation of circuit 200. Circuit 200 includes input terminal 201, level shifter 210, source follower 220, fixed current bias 230, current compensation circuit 240, and output terminal 299 as in FIG. 2, although with more detail. Specifically, circuit 200 further includes MOSFETs 212, 214, 222, 224, 242, 244, 246, and 248, and current sources 215, 217, 231, and 249. In the specific implementation of FIG. 3A, MOSFETs 212, 222, 246, and 248 are NMOS-type transistors, and MOSFETs 214, 224, 242, and 244 are PMOS-type transistors. In other implementations, other transistor configurations are possible such as reversing the NMOS and PMOS-type transistors proposed or using bipolar junction transistors (BJTs).

In one implementation, a size ratio (e.g., a ratio of the W:L ratios) of MOSFET 212 to MOSFET 222 substantially matches a size ratio of MOSFET 214 to MOSFET 224. In one implementation, a size of MOSFET 212 can substantially match a size of MOSFET 222, a size of MOSFET 214 can substantially match a size of MOSFET 224, and a size of MOSFET 242 can substantially match a size of MOSFET 244. In one implementation, a size of MOSFET 246 is substantially 10× a size of MOSFET 248. Other implementations can have other ratios, for example, according to the circuit operation described below.

A source of MOSFET 212 is coupled to receive input signal $V_{IN}$ and a drain of MOSFET 212 is coupled to current source 215. A source of MOSFET 214 is also coupled to receive input signal $V_{IN}$ and a drain of MOSFET 214 is coupled to current source 217.

Current sources 215, 217 provide current in order to keep MOSFETs 212, 214 in saturation.

A gate of MOSFET 222 is coupled to the gate of MOSFET 212 for receiving voltage $V_{IN}+V_{gs}$, and a source of MOSFET 222 is coupled to output terminal 299. A gate of MOSFET 224 is coupled to the gate of MOSFET 214 for receiving voltage $V_{IN}-V_{gs}$, and a source of MOSFET 224 is coupled to output terminal 299. The combination of MOSFET 222 and MOSFET 224 produce an uncompensated output signal $V_{out}$ at output terminal 299.

In one implementation, MOSFET 222 activates at substantially the same gate voltage as MOSFET 212. As a result, MOSFETs 212 and 222 provide a path for input signal $V_{IN}$ from input terminal 201 to output terminal 299. The voltage level of $V_{IN}$ drops from $V_{IN}+V_{gs}$ back to $V_{IN}$ because of a gate/source voltage difference $V_{gs}$ associated with MOSFET 222. Similarly, MOSFET 224 can activate at substantially the same gate voltage as MOSFET 214 to provide a path for input signal $V_{IN}$ at a potential of $V_{IN}$.

Current source 231 includes an output providing current $I_f$. In the implementation of FIG. 3A, current $I_f$ has a value of 20I relative to current sources 215 and 217 which have a value of I.

A gate of MOSFET 242 is coupled to receive uncompensated output signal $V_{OUT}$ and a source of MOSFET 242 is coupled to current source 249. A source of MOSFET 244 is also coupled to current source 249, a gate of MOSFET 244 is coupled to receive input signal $V_{IN}$, and a drain of MOSFET 244 is coupled to a drain of MOSFET 248. A gate of MOSFET 248 is coupled to a gate of MOSFET 246. A drain of MOSFET 246 is coupled to source or sink current from output node X. In the implementation shown, current source 249 is sized to produce a current 41 that is substantially 5× smaller than the fixed bias current $I_f$ provided by fixed bias 230.

During steady-state operation, current compensation circuit 240 sinks substantially all the current from fixed current bias 230. To do so, current source 249 provides a current (e.g., 4I) that is split substantially equally at node Y since the input voltage $V_{IN}$ and the output voltage $V_{OUT}$ apply substantially the same value of voltage to the gates of MOSFETs 242 and 244, respectively. Thus, MOSFET 248 sinks a current of substantially 2I during steady-state operation. Because MOSFET 246 has a W:L ratio that is substantially 10× greater than a W:L ratio of MOSFET 248, MOSFET 246 sinks a current of substantially 20I from node X.

During transient operation, current compensation circuit 240 sinks a variable amount of current from current source 231. For example, as the value of input signal $V_{IN}$ increases, and before either MOSFET 222 or 224 has raised the value of the output signal $V_{OUT}$ to match the increasing value of input-signal $V_{IN}$, the current will not be split at node Y Rather, MOSFET 244 sinks more current, and consequentially, MOSFET 248, sink less current (e.g., <2I) with a greater input signal $V_{IN}$. As a result, MOSFET 246 sinks less than the full current (e.g., <20I) from node X. The remaining current from current source 231 is discharged through the input resistance associated with MOSFET 224, allowing uncompensated output signal $V_{OUT}$ to rise accordingly to form compensated output signal $V_{OUT}$.

As the value of input signal $V_{IN}$ decreases, and before either MOSFET 222 or 224 have lowered the value of uncompensated output signal $V_{OUT}$ to match the decreasing value of input-signal $V_{IN}$, MOSFETs 244 and 248 sink more current (e.g., >2I) at node Y MOSFET 246 sinks more than the full current (e.g., >20I) from node X. Additional current is sunk to node X, through the input resistance associated with MOSFET 222, allowing uncompensated output signal $V_{OUT}$ to fall accordingly to form compensated output signal $V_{OUT}$.

Figure 3B:
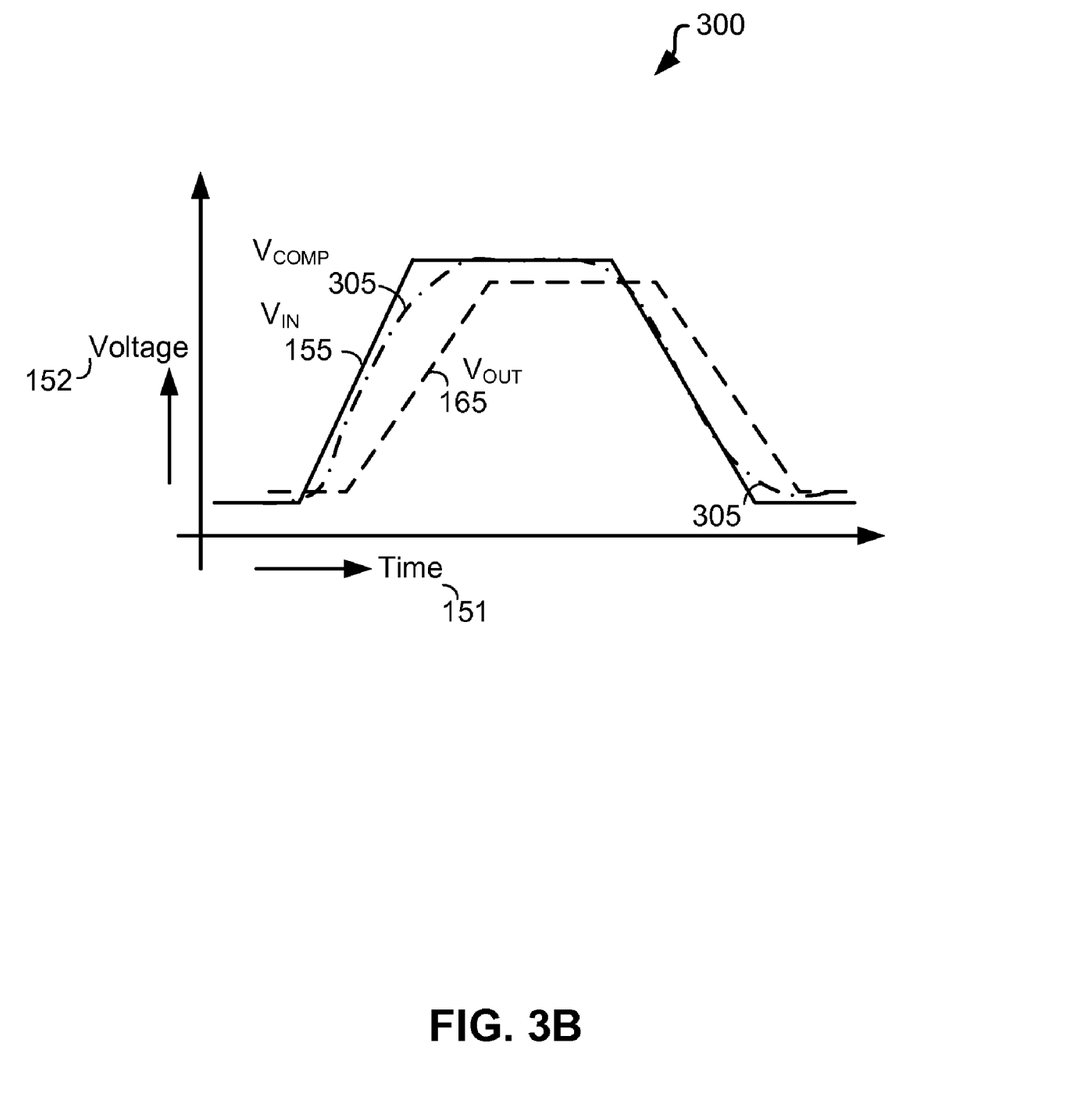
FIG. 3B is a graph illustrating voltage levels of an input signal relative to an output signal of the circuit of FIG. 2.

FIG. 3B is a graph illustrating a waveform of output signal $V_{OUT}$ relative to input signal $V_{IN}$. Similar to graph 150 of FIG. 1B, graph 300 of FIG. 3B includes an x-axis 151 representing time, a y-axis 152 representing voltage, an input signal $V_{IN}$ 155, and a compensated output signal $V_{OUT}$ 305. In addition, graph 300 includes an output signal $V_{CONV}$ 165 produced by a conventional source follower (e.g., source follower 100 of FIG. 1A). While output signal 165 lags input signal 155 with respect to time, output signal 305 has less delay (i.e., an improved slew rate). Moreover, where output signal 165 is clipped by a value $V_{gs}$ relative to input signal 155, output signal 305 has substantially the same value as input signal 155 (i.e., less clipping).

Figure 4:
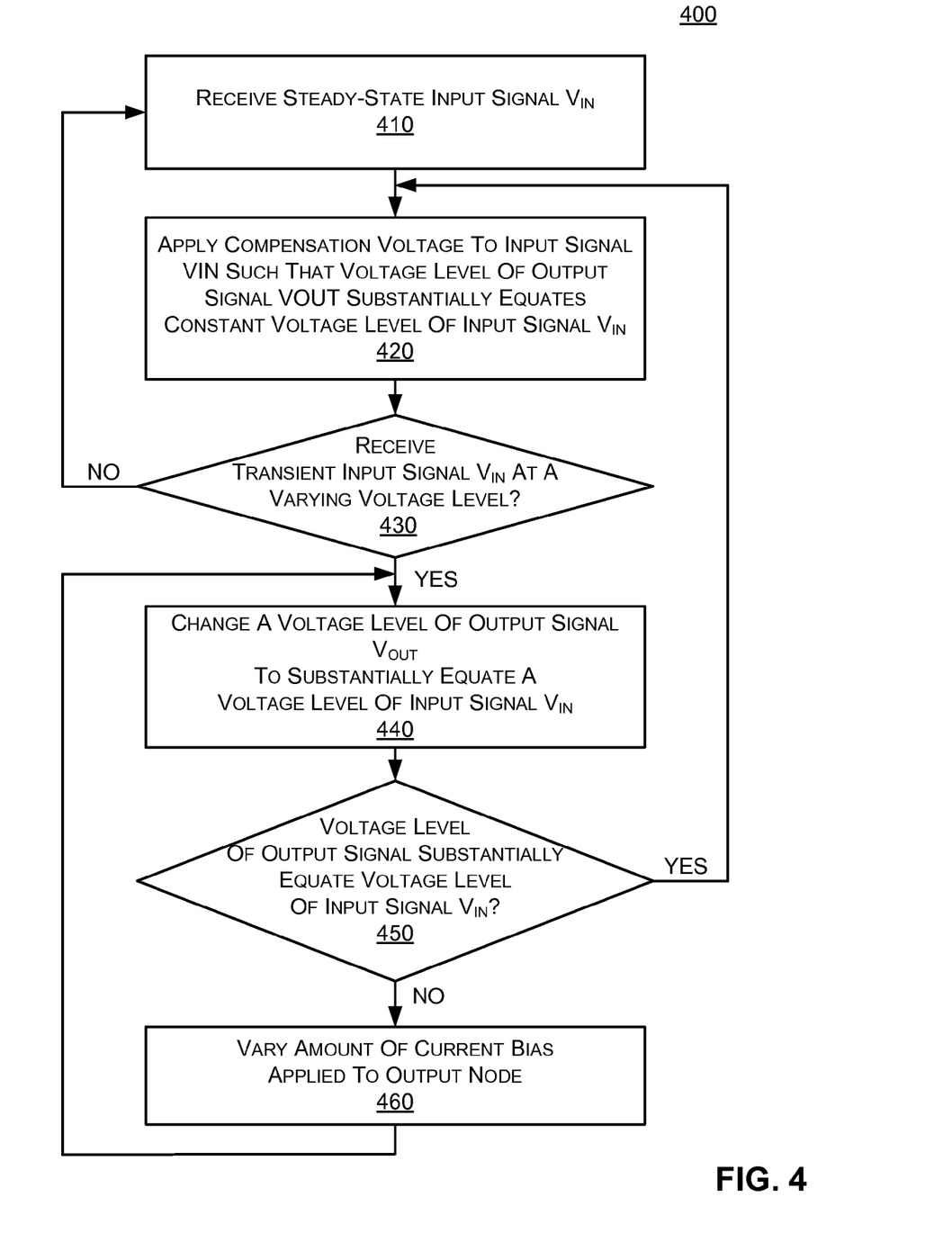
FIG. 4 is a flow diagram illustrating a method for producing a rail-to-rail output voltage in a low output impedance device.

FIG. 4 is a flow diagram illustrating a method 400 for producing a rail-to-rail voltage level in an output signal $V_{OUT}$. Generally, the techniques proposed are used to compensate for voltage clipping in, and to improve the slew rate of, a source follower (e.g., source follower 220). More specifically, an input signal $V_{IN}$ is received in steady-state when a voltage level is constant 410. A compensation voltage is applied (e.g., by level shifter 210) to input signal $V_{IN}$ such that a voltage level of an output signal $V_{OUT}$ substantially equates the constant voltage level of the input signal $V_{IN}$ 420.

A transition in input signal $V_{IN}$ is received as the voltage level varies 430 (e.g., during a rising edge or a falling edge). In response, the voltage level of the output signal $V_{OUT}$ is changed (e.g., by source follower 220) to substantially equate the voltage level of the input signal $V_{IN}$ 440.

While the voltage level of the output signal $V_{OUT}$ does not substantially equate the voltage level of input signal $V_{IN}$ 450, an amount of current bias applied to an output node (e.g., output node X) is varied 460 (e.g., by current compensation circuit 240 in conjunction with current source 230). As a result, additional current is available/required at the output node to raise/lower the voltage level of the output signal $V_{OUT}$. When the voltage level of the output signal $V_{OUT}$ substantially equates the voltage level of input signal $V_{IN}$ 450, the compensation voltage is applied 420 without further changes to the current bias.

Circuit 200 can be implemented as a component of an analog and/or digital circuit application, for example, a motor controller, a power amplifier, or a voltage regulator. In one implementation, circuit 200 can be included on a common substrate or an integrated circuit formed from silicon, gallium arsenide, and the like. In another implementation, source follower circuit 200 can be included on a common printed circuit board having separate substrates.

A number of implementations have been described. Nevertheless, it will be understood that various modifications may be made. In one implementation, for example, fixed current bias 230 sinks the constant current signal $I_f$ and current compensation circuit 240 sources the current signal $I_f$. Accordingly, other implementations are within the scope of the following claims.

What is claimed is:

1. A circuit, comprising:
   a level shifter to receive an input signal and apply an adjustment voltage to produce a voltage level in an output signal of the circuit during a first state that substantially equates a voltage level of the input signal during the first state; and
   a source follower in communication with the level shifter, the source follower producing an output signal and, responsive to variations in the voltage level of the input signal during a second state, changing the voltage level of the output signal including producing the output signal to have rise times and fall times that approximate the input signal.

2. The circuit of claim 1 further comprising a current compensation circuit, in communication with the source follower and receiving the input and output signals and, responsive to a difference between the voltage levels of the input and output signals, the current compensation circuit varying an amount of a biasing current provided to the source follower.

3. The circuit of claim 2, further comprising a current source to provide a constant current bias to an output node, wherein the current compensation circuit varies an amount of the biasing current as a portion of a constant current bias.

4. The circuit of claim 3, wherein the current source sources the constant current bias to the output node, and the current compensation circuit sinks a current from the output node.

5. The circuit of claim 3, wherein the current source sinks the constant current bias from the output node, and the current compensation circuit sources a current to the output node.

6. The circuit of claim 2, wherein the current compensation circuit includes a first MOSFET coupled to an output node to sink a portion of the biasing current responsive to the difference between the voltage levels of the input and output signals.

7. The circuit of claim 6, wherein the current compensation circuit further comprises a second current source and a second MOSFET coupled to the second current source and the first MOSFET, wherein the second MOSFET, responsive to the difference between the voltage levels of the input and output signals, sinks a portion of a second current produced by the second current source to control the first MOSFET.

8. The circuit of claim 7, wherein the current compensation circuit further comprises a third MOSFET coupled to the second current source and receiving the output signal and a portion of the second current, and a fourth MOSFET coupled to the second current source and receiving the input signal and a portion of the second current, wherein the fourth MOSFET sources the portion of the second current sunk by the second MOSFET responsive to the difference between the voltage levels of the input and output signals.

9. The circuit of claim 6, wherein the first MOSFET sinks substantially all of the constant bias current responsive to the voltage levels between the input and output signals being substantially equal.

10. The circuit of claim 1, wherein the level shifter applies the adjustment voltage substantially equivalent to one or more gate/source voltages $V_{gs}$ associated with the source follower.

11. The circuit of claim 1, wherein the level shifter includes a first MOSFET and a second MOSFET, the first and second MOSFETs having substantially complementary activation characteristics, wherein the first MOSFET adds a compensation voltage to the input signal and the second MOSFET subsequently removes the compensation voltage from the input signal to produce the output signal.

12. The circuit of claim 1, wherein the source follower includes a first MOSFET and a second MOSFET, the first and second MOSFETs having substantially complementary activation characteristics and producing the output signal.

13. The circuit of claim 12, wherein an input resistance associated the first MOSFET discharges a portion of a biasing current to decrease the voltage level of the output signal, and an input resistance associated with the second MOSFET discharges a portion of the biasing current to increase the voltage level of the output signal.

14. A method, comprising:
   receiving an input signal;
   applying an adjustment voltage to produce a voltage level in an output signal of a circuit during a first state that substantially equates a voltage level of the input signal during the first state;
   responsive to variations in the voltage level of the input signal during a second state, changing the voltage level of the output signal including approximating rise and fall times of the input signal.

15. The method of claim 14 further comprising using a biasing current to apply the adjustment voltage; and responsive to a difference between the voltage levels, of the input and output signals, varying an amount of the biasing current.

16. The method of claim 15, further comprising:
   providing a constant current bias to an output node,
   wherein the amount of the biasing current is varied as a portion of the constant current bias.

17. The method of claim 16, wherein providing includes sourcing the constant current bias to the output node, and wherein varying includes sinking a current from the output node.

18. The method of claim 16, wherein providing includes sinking the constant current bias from the output node, and wherein varying includes sourcing a current to the output node.

19. The method of claim 15, wherein varying includes sinking a portion of the biasing current responsive to the difference between the voltage levels of the input and output signals.

20. The method of claim 15, wherein varying includes sinking a portion of a second current to control the biasing current sinking.

21. The method of claim 20, wherein varying includes:
   receiving the output signal and a portion of the second current;
   receiving the input signal and a portion of the second current; and
   sourcing the portion of the second current sunk responsive to the difference between the voltage levels of the input and output signals.

22. The method of claim 19, wherein sinking the portion of the biasing current includes sinking substantially all of the biasing current responsive to the voltage levels between the input and output signals being substantially equal.

23. The method of claim 14, wherein applying includes applying the adjustment voltage substantially equivalent to one or more gate/source voltages $V_{gs}$.

24. The method of claim 14, wherein applying includes:
   adding a compensation voltage to the input signal; and
   subsequently removing the compensation voltage from the input signal to produce the output signal.

25. The method of claim 14, further comprising:
   activating a first MOSFET substantially complementary to a second MOSFET to produce the output signal.

26. The method of claim 15, further comprising:
   discharging a portion of the biasing current with a first input resistance to decrease the voltage level of the output signal; and
   discharging a portion of the biasing current with a second input resistance to increase the voltage level of the output signal.

* * * * *